US009224823B2

(12) United States Patent
Katoh et al.

(10) Patent No.: US 9,224,823 B2
(45) Date of Patent: Dec. 29, 2015

(54) SEMICONDUCTOR APPARATUS

(71) Applicant: KABUSHIKI KAISHA TOSHIBA, Minato-ku (JP)

(72) Inventors: Shunsuke Katoh, Kawasaki (JP); Yusuke Kawaguchi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 15 days.

(21) Appl. No.: 14/023,339

(22) Filed: Sep. 10, 2013

(65) Prior Publication Data

US 2014/0284711 A1 Sep. 25, 2014

(30) Foreign Application Priority Data

Mar. 22, 2013 (JP) ................................. 2013-060401

(51) Int. Cl.
*H01L 29/78* (2006.01)
*H01L 29/417* (2006.01)

(52) U.S. Cl.
CPC ...... *H01L 29/41741* (2013.01); *H01L 29/7813* (2013.01)

(58) Field of Classification Search
CPC ............ H01L 29/7813; H01L 29/4236; H01L 29/0696; H01L 29/4238; H01L 29/407
USPC ........................................................ 257/331
See application file for complete search history.

(56) References Cited

U.S. PATENT DOCUMENTS

| 8,629,505 | B2 | 1/2014 | Nishiwaki | |
|---|---|---|---|---|
| 2004/0016963 | A1* | 1/2004 | Baliga | 257/330 |
| 2009/0140327 | A1* | 6/2009 | Hirao et al. | 257/328 |
| 2012/0061753 | A1 | 3/2012 | Nishiwaki | |

FOREIGN PATENT DOCUMENTS

| JP | 05-090595 A | 4/1993 |
|---|---|---|
| JP | 2005-528796 A | 9/2005 |
| JP | 2008-227514 A | 9/2008 |
| JP | 2011-082401 A | 4/2011 |
| JP | 2012-059943 A | 3/2012 |
| JP | 2012-109580 A | 6/2012 |

OTHER PUBLICATIONS

Japanese Office Action issued Jun. 16, 2015 in Japanese Patent Application No. 2013-060401.

* cited by examiner

*Primary Examiner* — Monica D Harrison
(74) *Attorney, Agent, or Firm* — White & Case LLP

(57) ABSTRACT

A semiconductor apparatus includes a drain region of a first-conductivity type, a drain electrode electrically coupled to the drain region, and a semiconductor layer of the first-conductivity type formed onto the drain region and having a first impurity concentration. The semiconductor apparatus further includes: a source region of the first-conductivity type formed on the semiconductor layer and having a second impurity concentration; a first source electrode electrically coupled to the source region; and a gate electrode formed via an insulating layer. The one end of the gate electrode is in a depth of the source region, and the other end is in a depth of the semiconductor layer or the drain region. A second source electrode is provided in the semiconductor layer under the gate electrodes via an insulating layer. A second spacing between the second source electrodes is larger than a first spacing between the gate electrodes.

6 Claims, 6 Drawing Sheets

SEMICONDUCTOR APPARATUS

CROSS REFERENCE TO RELATED APPLICATIONS

This application is based on and claims the benefit of priority from prior Japanese Patent Application No. 2013-60401, filed on Mar. 22, 2013, the entire contents of which are incorporated herein by reference.

FIELD

Embodiments described herein relate generally to a semiconductor apparatus.

BACKGROUND

In recent years, in semiconductor circuit elements that conduct a large current and include high-breakdown-voltage components, decreasing gate-to-drain capacitance has been demanded to lower the on-resistance and decrease switching losses. The on-resistance of semiconductor circuit elements is caused principally by drift resistance within drift layers and channel resistance within channel areas. Attempting reduced on-resistance is a crucial issue.

One known example is a semiconductor circuit element in which the gate electrode is formed inside a trench extending perpendicularly to the semiconductor substrate. In such semiconductor circuit elements, technology for reducing channel resistance by narrowing the spacing between a plurality of the trenches is known.

Narrowing the trench spacing, however, means that the drift-layer regions are also narrowed and the drift resistance rises. This is a problem. Consequently, with technology to date, attaining reduced drift resistance while also attaining reduced channel resistance is not easy.

DETAILED DESCRIPTION

According to one embodiment, a semiconductor apparatus of the embodiment described in the following includes a drain region of a first conductivity type, a drain electrode electrically coupled to the drain region, and a semiconductor layer of the first conductivity type formed onto the drain region and having a first impurity concentration. The semiconductor apparatus further includes: a source region of the first conductivity type formed on the semiconductor layer and having a second impurity concentration greater than the first impurity concentration; a first source electrode electrically coupled to the source region; and a gate electrode formed via an insulating layer. The gate electrode has one end and another end. The one end is in a depth of the source region, and the other end is in a depth of the semiconductor layer or the drain region. A second source electrode is provided in the semiconductor layer under the gate electrodes via an insulating layer. The second source electrode is electrically coupled to the first source electrode. A second spacing in between a plurality of the second source electrodes is configured larger than a first spacing in between a plurality of the gate electrodes.

Next, with reference to the drawings, a description of a semiconductor apparatus according to the present embodiment will be made in detail. It should be understood that the following description is made with the first conductivity type being n-type and the second conductivity type being p-type, but it may just as well be the reverse, with the first conductivity type being p-type and the second conductivity type be n-type. Also, in the following, "$n^+$-type" means that the impurity concentration is higher than that of "n-type," and "n-type" means that the impurity concentration is higher than that of "$n^-$-type." Likewise with regard to p-type: "$p^+$-type" means that the impurity concentration is higher than that of "p-type," and "p-type" means that the impurity concentration is higher than that of "$p^-$-type."

Various embodiments will be described hereinafter with reference to the accompanying drawings.

First Embodiment

Figure 1:
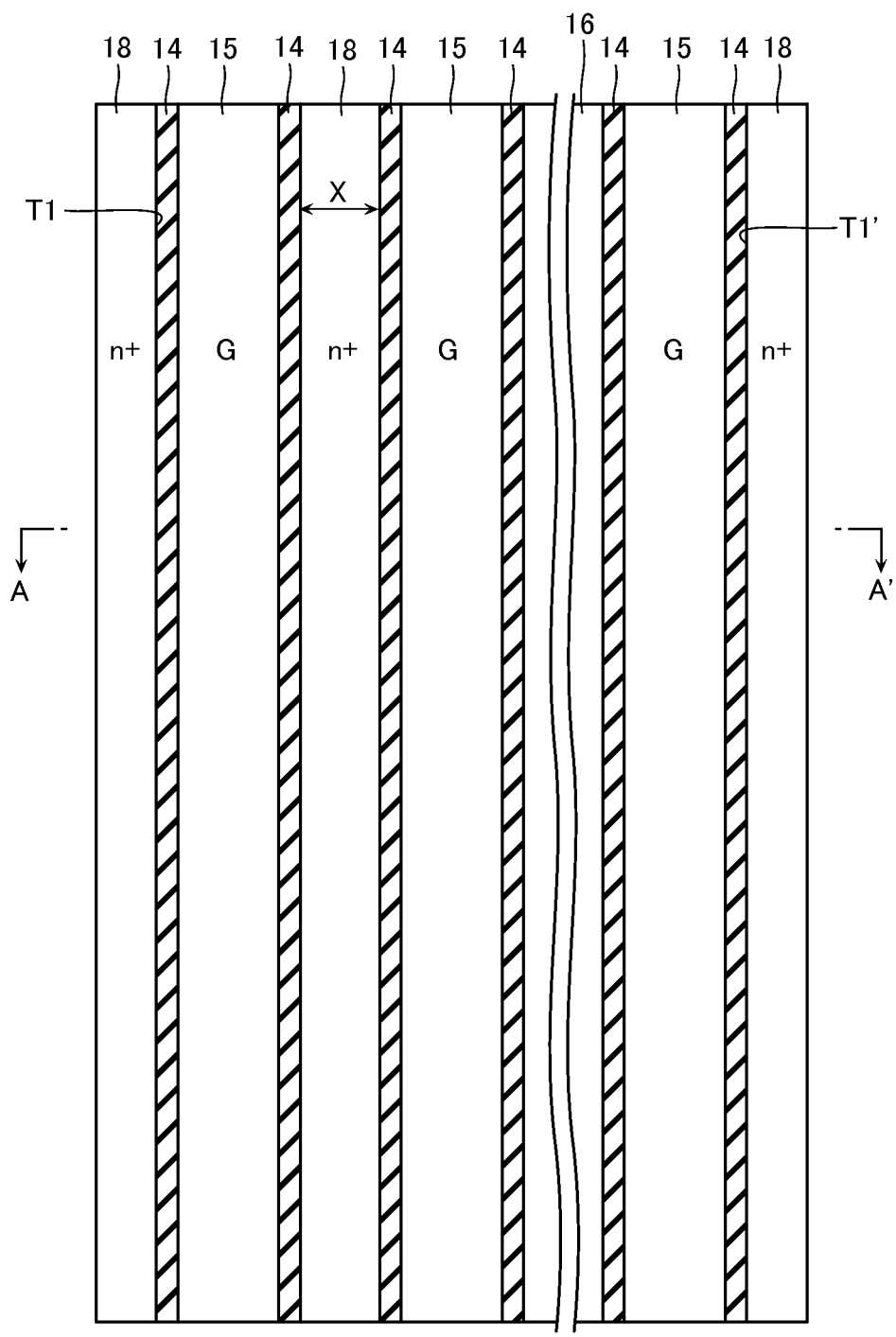
FIG. 1 is a plan view of a semiconductor apparatus according to a first embodiment.

To begin with, referring to FIGS. 1 through 4, a description of a semiconductor apparatus according to a first embodiment will be made. FIG. 1 is a plan view (with source electrodes 17 being omitted) of a semiconductor apparatus according to the first embodiment, while FIG. 2 is a sectional view along A-A' therein.

Figure 2:
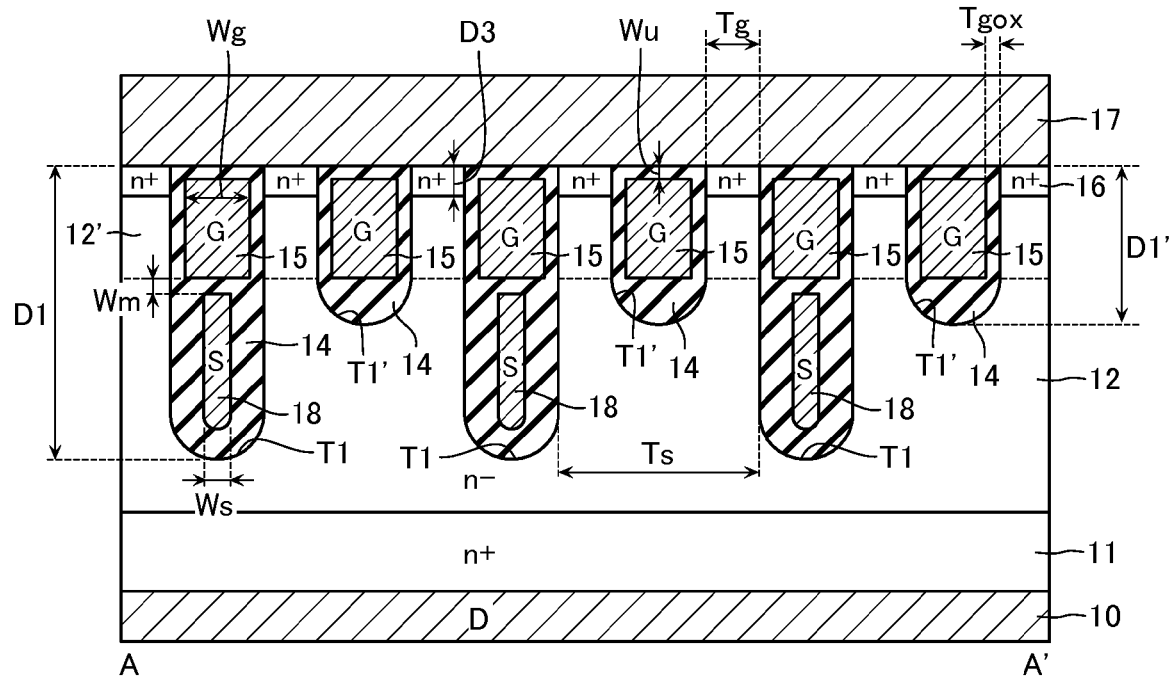
FIG. 2 is a sectional view along A-A' in FIG. 1.

As illustrated in FIG. 2, a semiconductor apparatus of the embodiment includes an $n^+$-type semiconductor substrate 11 as a drain region, and a drift layer 12 (semiconductor layer) as an $n^-$-type epitaxial layer, formed by epitaxial growth onto the substrate, with, for example, silicon as the material, and includes a trench-gate MOSFET onto the drift layer 12. A drain electrode 10 is electrically coupled to the back side of the $n^+$-type semiconductor substrate 11. The impurity concentration of the $n^+$-type semiconductor substrate 11 is designed to be some $5.0 \times 10^{19}$ to $1.0 \times 10^{20}$ cm$^{-3}$, for example, while the impurity concentration of the drift layer 12 can be designed to be some $1.75 \times 10^{17}$ cm$^{-3}$, for example. The impurity concentration of the upper layer portions 12' of the drift layer 12, nevertheless, can be designed to be smaller than that-some $1.0 \times 10^{16}$ cm$^{-3}$, for example.

In addition, a plurality of trenches T1 (first trenches) and T1' (first trenches) at equal spacing is formed on the surface of the drift layer 12 by photolithography and reactive-ion etching (RIE). The trenches T1 are of greater depth than the trenches T1'. In the FIG. 2 example, the trenches T1 and T1' are provided alternating with one another along the line A-A' (sideways). And while the trenches T1 and T1' in this example have a striped configuration in which they extend vertically in the plane of the FIG. 2 sheet, as will be apparent from what is stated in the description later, the geometry of the trenches is not limited to a striped configuration.

Gate electrodes 15 made of polysilicon or the like are embedded in the shorter trenches T1', via insulating films 14.

Gate electrodes 15 are also embedded in the longer trenches T1, via insulating films 14 (gate-insulating films), and at the same time, buried source electrodes 18 (second source electrodes) are embedded therein, via insulating films 14. In other words, one ends of the gate electrodes 15 are in a first position in the drift layer 12, while the other ends are in a second position lower into the drift layer 12 than the first position.

The buried source electrodes 18 are provided under the gate electrodes 15 in the trenches T1, and are of width Ws that is smaller than the width Wg of the gate electrodes 15 along the line A-A'. In other words, the buried source electrodes 18 are provided within the drift layer 12 under the gate electrodes 15, with insulating films 14 interposing. The buried source electrodes 18 are electrically coupled with (shorted to) the source electrode 17 in positions not illustrated in FIG. 2.

It should be noted that the difference between the work function of the silicon that is the material of the drift layer 12, and the work function of the material of the gate electrodes 15 is designed so as to be at or above the threshold voltage of the MOSFET.

Further, on the surface of the drift layer 12' interposed between the gate electrodes 15, an $n^+$-type source region 16 is formed, with the source region 16 being electrically coupled to the source electrode 17. The impurity concentration of the source region 16 is designed to be some $1.0 \times 10^{19}$ cm$^{-3}$, for example—greater than the impurity concentration of the drift layer 12.

In the configuration according to the first embodiment, on the one hand the gate electrodes 15 are formed in both the trenches T1 and T1', while the buried source electrodes 18 are formed only in the trenches T1, under the gate electrodes 15. On this account, the spacing Ts of the buried source electrodes 18 is of greater extent than the spacing Tg of the gate electrodes 15.

In the research and development of semiconductor apparatuses in recent years, in order to reduce on-resistance, lessening the spacing (pitch) between the trenches in which gate electrodes are embedded has been desired. Narrowing the trench spacing enables readily depleting the channel areas in the nonconductive state of semiconductor apparatuses, even without a p-type base layer being formed in the channel areas. This is owing to the existence of a difference in work function between the gate electrodes and the silicon layer of the channel areas.

The presence of a p-type base layer in between trenches gives rise to the necessity of elevating the concentration of the p-type base layer in order to obtain the requisite threshold voltage, and this impedes reduction in channel resistance that is in proportion to the micro-scaling of the trench spacing. Eliminating the necessity of forming a p-type base layer in the channel areas enables a reduction in channel resistance that is in proportion to the downsizing of the trench spacing.

Narrowing the trench spacing may reduce the channel resistance. However, it also reduces the width of the drift region. Accordingly, the so-called field plate effect cannot be sufficiently obtained and the drift resistance increases. This is thought to be a problem. Thus, there has been a tradeoff between reduction in channel resistance and reduction in drift resistance.

Accordingly, the first embodiment includes the structure illustrated in FIG. 2. Namely, in the shorter trenches T1' the gate electrodes 15 alone are embedded, while in the longer trenches T1, not only the gate electrodes 15 are embedded, but also the buried source electrodes 18. Accordingly, the spacing Ts in between the buried source electrodes 18 (spacing that excludes the thickness of the insulating films 14) is greater than the spacing Tg between the gate electrodes 15 (spacing that excludes the thickness of the insulating films 14). With the spacing Tg being narrowed the channel resistance is reduced; meanwhile, since the buried source electrodes 18 are formed only in the trenches T1, the spacing Ts is designed larger than the spacing Tg. That means that the drift layer is not constricted, which enables reduction of the drift resistance as well. In other words, according to the embodiment, the channel resistance is reduced while securing of the breakdown voltage due to the field plate effect is made possible, and in addition it becomes possible to reduce the drift resistance.

It is to be noted that the dimensions of the various components (See FIG. 2) can be, in one example, designed as follows.

Width Wg of gate electrodes 15 along line A-A': Wg=0.15 μm

Width Ws of buried source electrodes 18 along line A-A': Ws=0.05 μm

Figure 3:
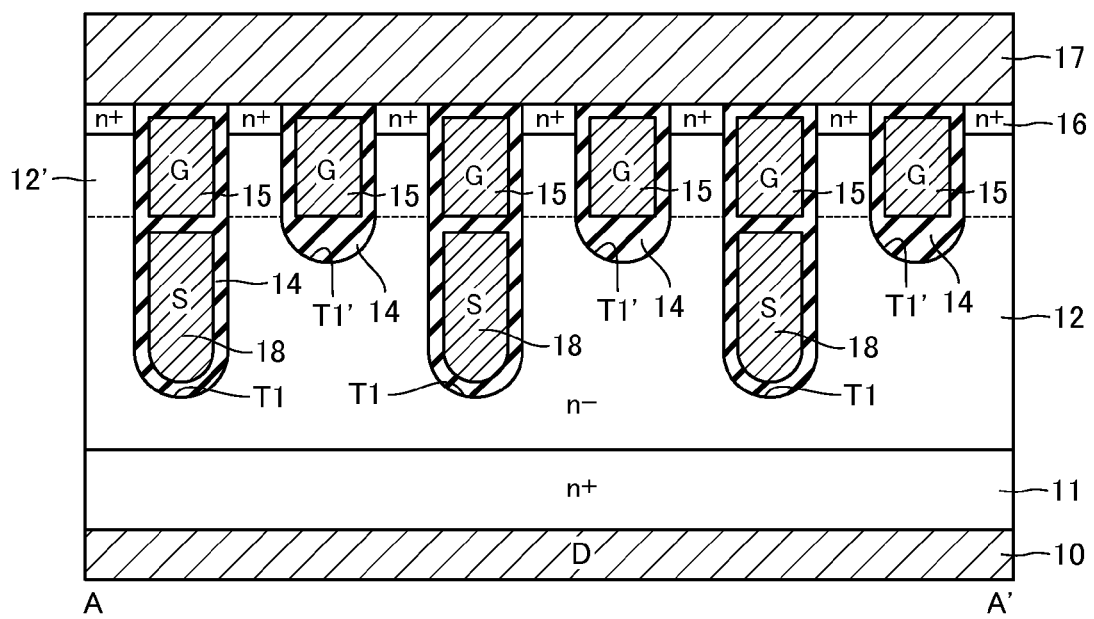
FIG. 3 is a sectional view of Modified Example 1 of the first embodiment.

Thickness Wu of insulating film 14 between gate electrodes 15 and source electrode 17: Wu=0.15 μm Thickness Wm of insulating film 14 between the gate electrodes 15 and buried source electrodes 18: Wm=0.1 μm Depth D1 of trenches T1: D1=2.0 μm Depth D1' of trenches T1': D1'=0.8 μm Junction depth D3 of source region 16: D3=0.2 μm Thickness Tgox of insulating film 14 adjoining gate electrodes 15: Tgox=0.05 μm Separation Tg between gate electrodes 15: Tg=0.1 μm Separation Ts between buried source electrodes 18: Ts=0.45 μm FIG. 3 illustrates Modified Example 1 of the first embodiment. In this Modified Example 1, the width of the buried source electrodes 18 along the line A-A' is substantially the same as the width of the gate electrodes 15 along the line A-A'. Since the separation Ts is greater than Tg in this case as well, the same advantages can be achieved.

Figure 4:
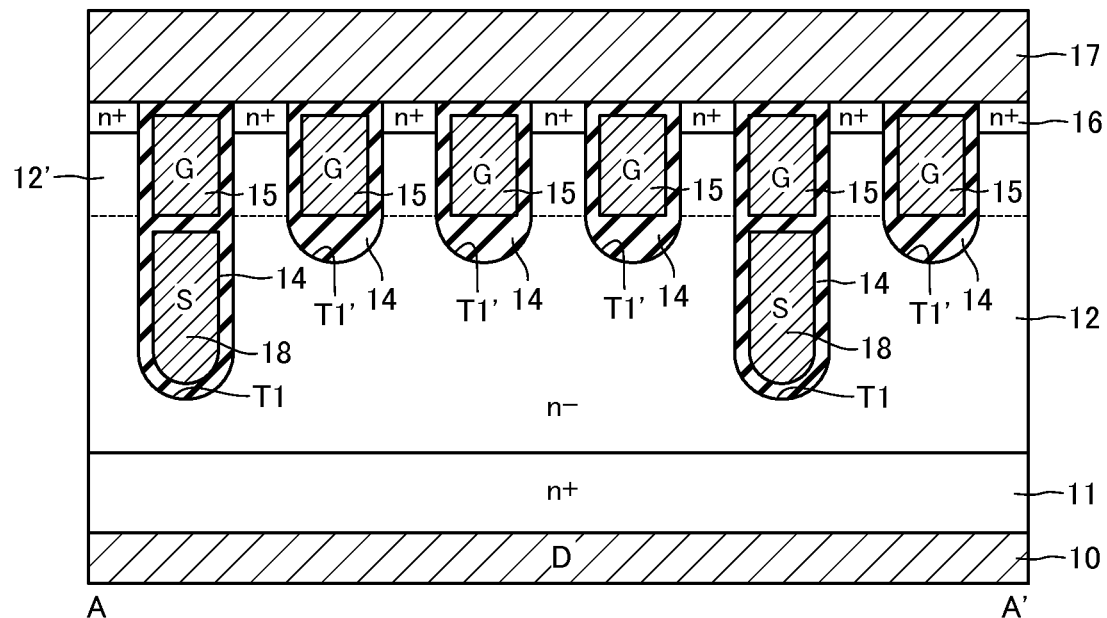
FIG. 4 is a sectional view of Modified Example 2 of the first embodiment.

FIG. 4 illustrates Modified Example 2 of the first embodiment. In this Modified Example 2, three shorter trenches T1' are rowed consecutively, with every fourth being formed as a longer trench T1. Since the separation Ts is greater than Tg in this case as well, the same advantages can be achieved. In this example, three shorter trenches T1' are rowed consecutively, but of course that number is not limited to being three. Likewise, it is possible to form a plurality of consecutive trenches T1.

Second Embodiment

Figure 5:
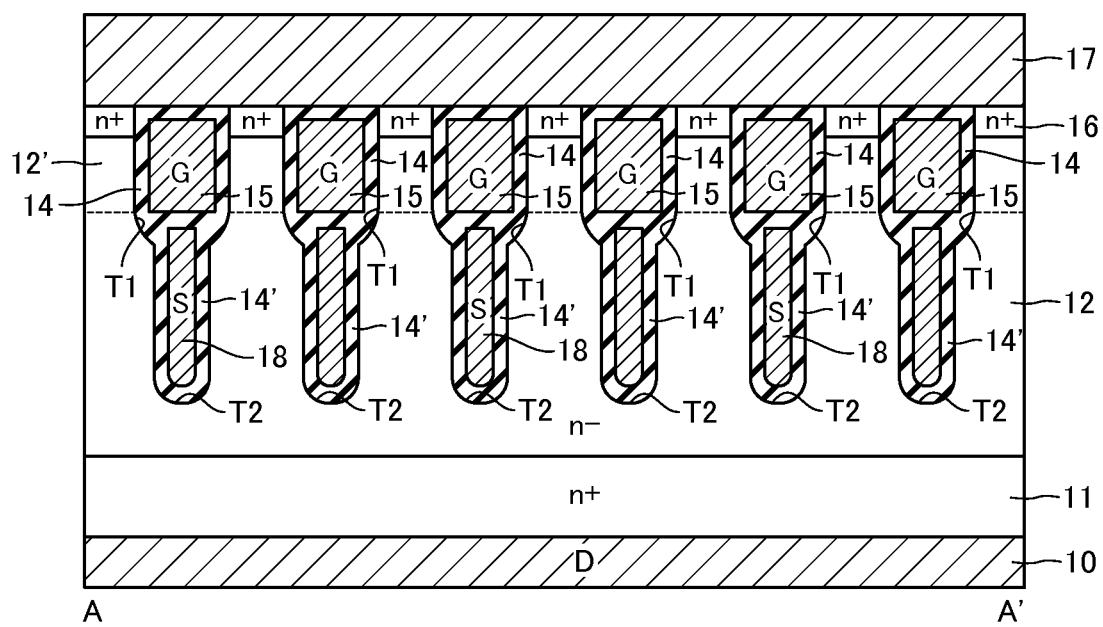
FIG. 5 is a sectional view of a semiconductor apparatus according to a second embodiment.

Next, referring to FIG. 5, a description of a semiconductor apparatus according to a second embodiment will be made. The plan view of the second embodiment is the same as that according to the first embodiment (FIG. 1). FIG. 5 is an A-A' sectional view of the second embodiment. This embodiment differs from the first embodiment in that under the trenches T1, trenches T2 are further provided. The width of the trenches T1 along the line A-A' is greater than the width of the trenches T2 along the line A-A'. Thus, the width of the buried source electrodes 18 along the line A-A' is likewise smaller than the width of the gate electrodes 15 along the line A-A'. The same advantages as with the first embodiment can therefore be achieved.

Third Embodiment

Figure 6:
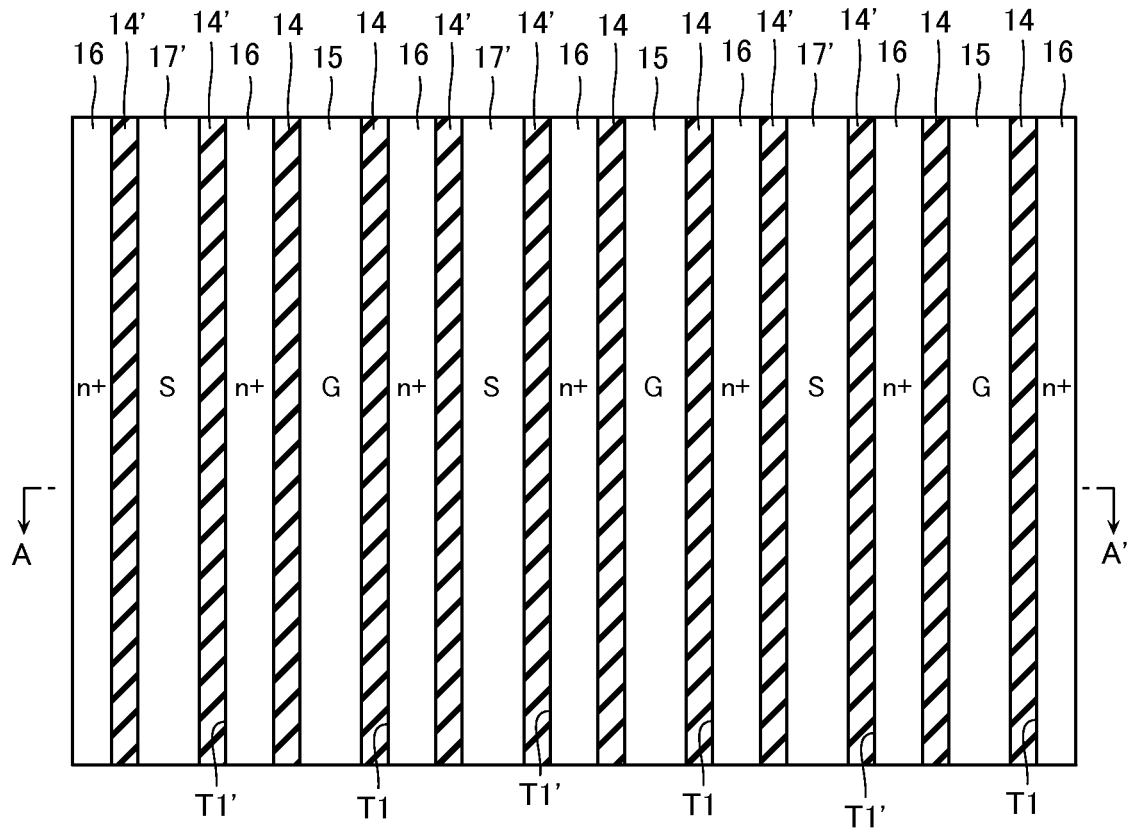
FIG. 6 is a plan view of a semiconductor apparatus according to a third embodiment.
Figure 7:
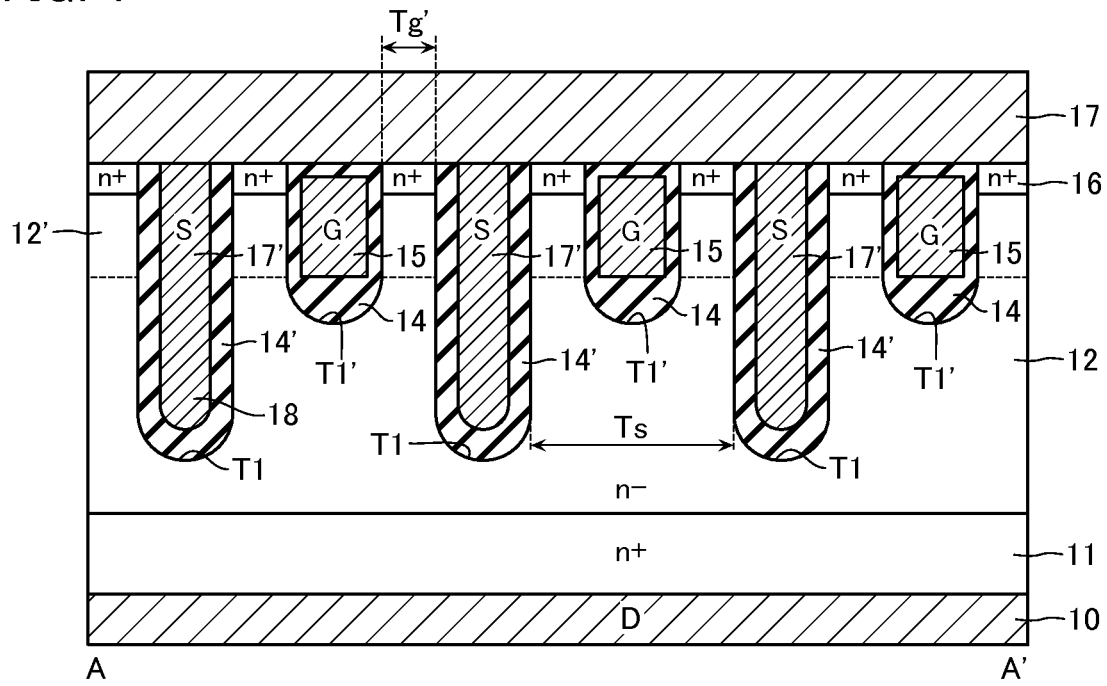
FIG. 7 is a sectional view along A-A' in FIG. 6 of the third embodiment.

Next, referring to FIGS. 6 and 7, a description of a semiconductor apparatus according to a third embodiment will be made. FIG. 6 is a plan view of a semiconductor apparatus according to a third embodiment (with the source electrode 17 omitted), while FIG. 7 is an A-A' sectional view thereof. Configurational elements identical with those according to the first embodiment are labeled with reference marks identical with those of FIGS. 1 and 2, and description of those elements that would be redundant is omitted.

In the third embodiment, the longer trenches T1 and the shorter trenches T1' are provided in alternation, and on the one hand, in the trenches T1' the gate electrodes 15 alone are embedded, with the insulating films 14 interposing, while in the trenches T1, buried source electrodes 17' alone are embedded, with the insulating films 14 interposing. This is a point of difference with the previously described embodiment. The buried source electrodes 17' are different from the buried source electrodes 18 of the first and second embodiments; not being formed under the gate electrodes 15, the buried source electrodes 17' are formed in such away that their upper ends are exposed in the surface of the drift layer 12. That is, the buried source electrodes 17' are in direct contact with the source electrode 17, in the surface of the drift layer 12.

In other words, the plurality of gate electrodes 15 is formed in the drift layer 12, with the insulating films 14 interposing, and is formed such as to have a first depth from the surface of the drift layer 12. Meanwhile, the buried source electrodes 17' are formed in the drift layer 12 interposed between the gate electrodes 15, with the insulating films 14 interposing, and are formed such as to have a second depth from the surface of the drift layer 12 that is greater than the first depth.

According to this embodiment, on the one hand the distance Tg' between the gate electrodes 15 and the buried source electrodes 17' (distance excluding the thickness of the insulating films 14) is designed to be narrower, while the distance Is between the buried source electrodes 17' is designed to be wider. This makes it possible for the same advantages as with the earlier-described embodiments to be achieved. A further benefit with this embodiment is that electrical contact between the source electrode 17 and the buried source electrodes 17' is readily obtained because the buried source electrodes 17' are exposed in the surface of the drift layer 12.

Fourth Embodiment

Figure 8:
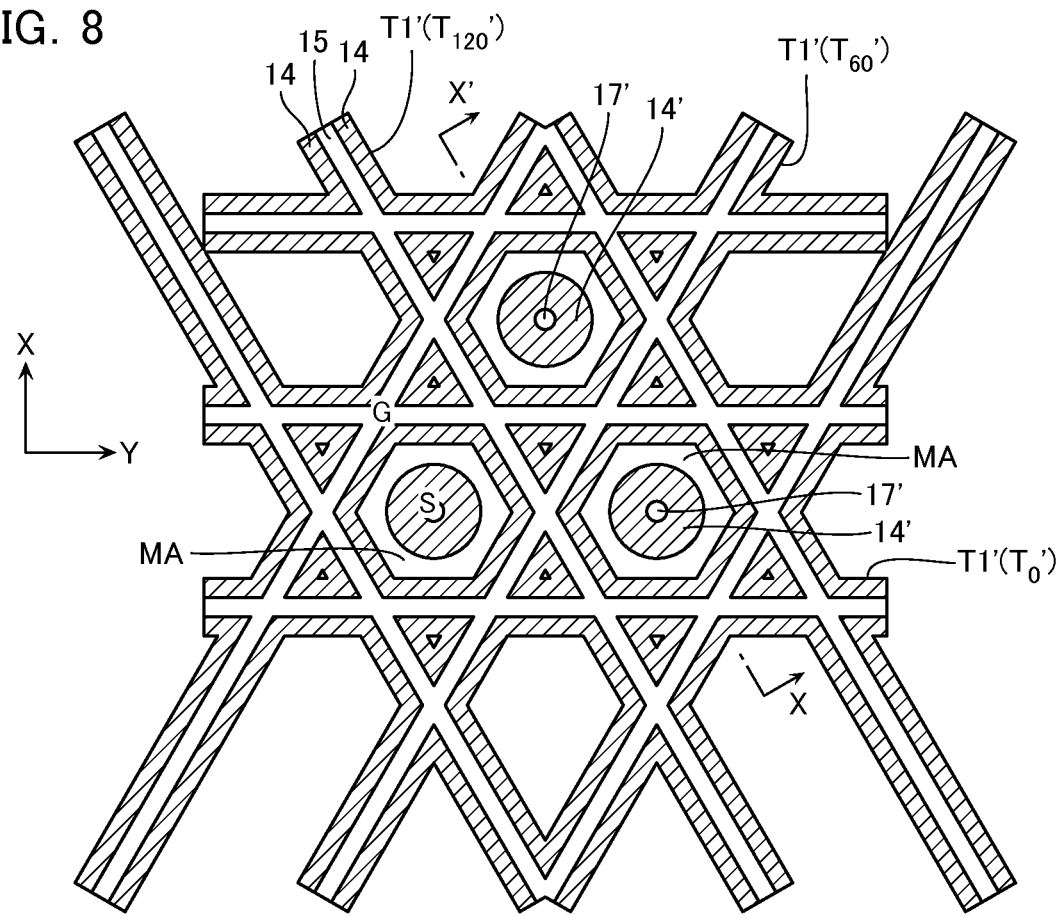
FIG. 8 is a plan view of a semiconductor apparatus according to a fourth embodiment.
Figure 9:
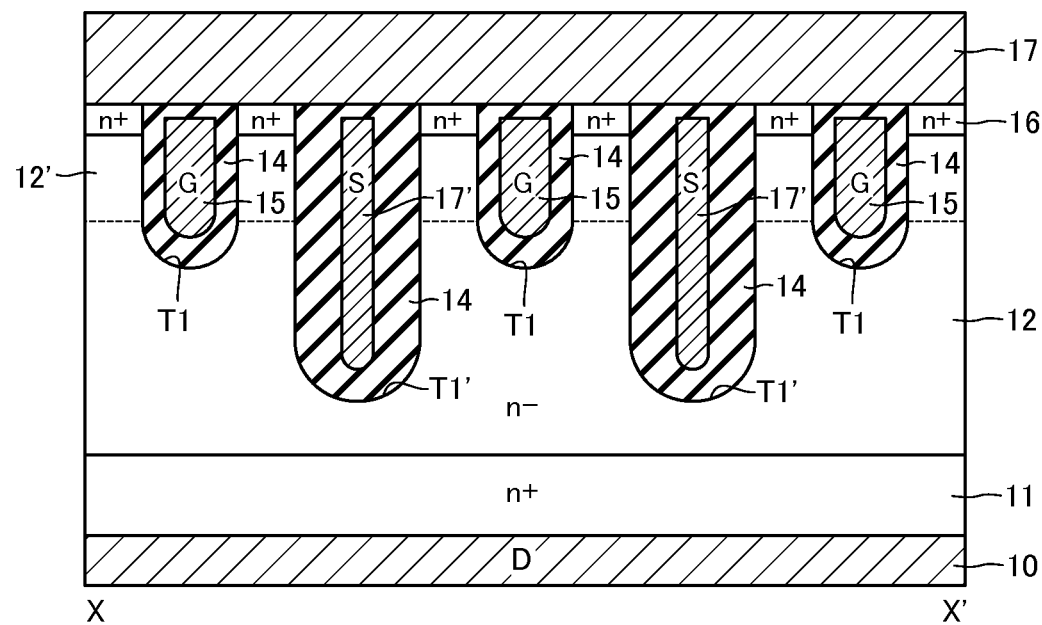
FIG. 9 is a sectional view along A-A' in FIG. 8.

Next, referring to FIGS. 8 and 9, a description of a semiconductor apparatus according to a fourth embodiment will be made. FIG. 8 is a plan view of a semiconductor apparatus according to a fourth embodiment (with the source electrode 17 omitted), while FIG. 9 is an X-X' sectional view thereof. Configurational elements identical with those according to the first embodiment are labeled with reference marks identical with those of FIGS. 1 and 2, and description of those elements that would be redundant is omitted.

With the semiconductor apparatus of the fourth embodiment, the planar structure differs from that of the aforedescribed embodiments. Namely, whereas the trenches T1' for the formation of the gate electrodes 15 were, in the aforedescribed embodiments, configured in the form of stripes extending in the same direction, in this embodiment, the trenches T1' are configured in the form of a mesh (accordingly, the gate electrodes 15 are configured in the form of a mesh extending in directions in parallel with the drain region 11). Especially, the trenches T1' include, with respect to the x-axis indicated in FIG. 8, trenches $T_{60}'$ extending along a 60° line, trenches $t_{120}'$ extending along a 120° line, and trenches $T_0'$ extending along a 0° line.

Therein, the buried source electrodes 17' are formed in the mesh areas MA formed (partitioned) by the intersection of these trenches $T_{60}'$, $T_{120}'$ and $T_0'$ (and by the gate electrodes 15 formed within the trenches). Although in the non-conductive state the buried source electrodes 17' are effective to promote depletion-layer spread, heightening the breakdown voltage, the buried source electrodes 17' become null regions rather than functioning sections when the semiconductor apparatus is in a conduction state. In this embodiment, since the buried source electrodes 17' are as described above formed only in the mesh sections, compared with the third embodiment having the striped configuration, the null regions are made fewer (as one example, whereas in the third embodiment the proportion of null regions is some 42%, in the fourth embodiment, the proportion of null regions is some 17%), and as a result, the semiconductor apparatus can be downscaled.

Fifth Embodiment

Figure 10:
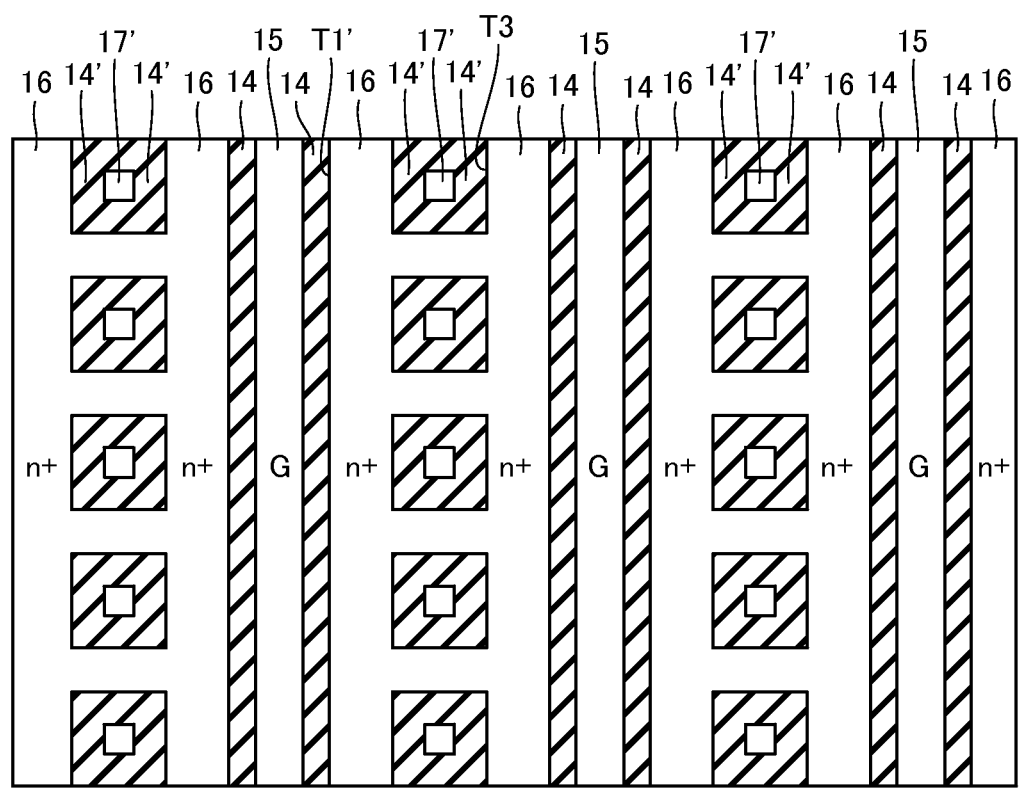
FIG. 10 is a plan view of a semiconductor apparatus according to a fifth embodiment.

Next, referring to FIG. 10, a description of a semiconductor apparatus according to a fifth embodiment will be made. FIG. 10 is a plan view of a semiconductor apparatus according to a fifth embodiment (with the source electrode 17 omitted). Since the cross-sectional structure is approximately the same as that of the aforedescribed embodiments, description thereof is omitted.

In the fifth embodiment, the gate electrodes 15 are embedded in trenches T1' in the form of stripes, while on the other hand, the buried source electrodes 17' are embedded in rectangularly shaped trenches T3, formed in between the trenches T1'. By using this configuration as well, the proportion of null regions can be held down, to some 33%, consequently enabling downscaling of the semiconductor circuit elements.

Other Embodiments

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor apparatus comprising:
   a drain region of a first conductivity type;
   a drain electrode electrically coupled to the drain region;
   a semiconductor layer of the first conductivity type formed onto the drain region, the semiconductor layer having a first impurity concentration;
   a source region of the first conductivity type formed on the semiconductor layer, the source region having a second impurity concentration greater than the first impurity concentration;
   a first source electrode electrically coupled to the source region;
   a gate electrode formed via an insulating layer, the gate electrode having one end and another end, the one end being in a depth of the source region, and the other end being in a depth of the semiconductor layer or the drain region;
   a second source electrode provided in the semiconductor layer under the gate electrodes via an insulating layer;

a first portion extending downward from a surface of the semiconductor layer to have a first depth, the first portion interiorly including the gate electrode and including the second source electrode under the gate electrode; and a second portion extending downward from a surface of the semiconductor layer to have a second depth smaller than the first depth, the second portion interiorly including the gate electrode alone, wherein a second spacing in between a plurality of the second source electrodes is configured larger than a first spacing in between a plurality of the gate electrodes.

2. The semiconductor apparatus according to claim 1, wherein an upper layer portion of the semiconductor layer has a third impurity concentration smaller than the first impurity concentration.

3. The semiconductor apparatus according to claim 1, wherein the second source electrode is embedded in a position under a part of the plurality of the gate electrodes.

4. The semiconductor apparatus according to claim 3, wherein the second source electrode has a smaller width in a first direction than the gate electrodes.

5. The semiconductor apparatus according to claim 3, wherein the second source electrode has a same width in a first direction as a width of the gate electrodes in the first direction.

6. The semiconductor apparatus according to claim 3, wherein an upper layer portion of the semiconductor layer has a third impurity concentration smaller than the first impurity concentration.

* * * * *